United States Patent [19]
Buice et al.

[11] Patent Number: 5,816,476
[45] Date of Patent: Oct. 6, 1998

[54] DUAL FREQUENCY POWER SUPPLY AND TRANSDUCER

[75] Inventors: David Buice, Dallas; Cesar Alfaro, Carrollton; Mike Whelan, Coppell, all of Tex.

[73] Assignee: Verity Instruments Inc., Carrollton, Tex.

[21] Appl. No.: 643,305

[22] Filed: May 10, 1996

Related U.S. Application Data

[63] Continuation-in-part of Ser. No. 295,992, Aug. 24, 1994, Pat. No. 5,595,330.

[51] Int. Cl.$^6$ ..................................................... B23K 20/10
[52] U.S. Cl. ........................ 228/102; 228/110.1; 228/1.1
[58] Field of Search ............................... 228/102, 110.1, 228/1.1

[56] References Cited

U.S. PATENT DOCUMENTS

| | | |
|---|---|---|
| 3,054,309 | 9/1962 | Elmore et al. . |
| 4,824,005 | 4/1989 | Smith, Jr. ................................ 228/102 |
| 5,046,654 | 9/1991 | Yamazaki et al. ...................... 228/102 |
| 5,201,454 | 4/1993 | Alfaro et al. . |
| 5,244,140 | 9/1993 | Ramsey et al. . |
| 5,275,324 | 1/1994 | Yamazaki et al. ....................... 228/1.1 |
| 5,433,369 | 7/1995 | Okumura ................................ 228/102 |

FOREIGN PATENT DOCUMENTS

| | | | |
|---|---|---|---|
| 651920 | 3/1979 | U.S.S.R. ................................. 228/1.1 |
| 880667 | 11/1981 | U.S.S.R. ................................. 228/1.1 |

*Primary Examiner*—P. Austin Bradley
*Assistant Examiner*—Jeffrey T. Knapp
*Attorney, Agent, or Firm*—Arthur F. Zobal

[57] ABSTRACT

The power supply may be operated during a given cycle sequentially to produce high and low frequency drive signals for operating an ultrasonic transducer for sequentially producing an ultrasonic output at the two frequencies to carry out bonding operations at two different bond sites respectively.

5 Claims, 6 Drawing Sheets

DUAL FREQUENCY POWER SUPPLY AND TRANSDUCER

This application is a continuation-in-part of U.S. patent application Ser. No. 08/295,992, filed Aug. 24, 1994, now U.S. Pat. No. 5,595,330.

BACKGROUND OF THE INVENTION

1. Field of the Invention

The invention relates to a power supply for use for operating an ultrasonic transducer at a different frequencies for carrying out welding or bonding operations on circuits such as integrated circuits.

2. Description of the Prior Art

Ultrasonic transducers for welding purposes have been employed for many years as exemplified by U.S. Pat. Nos. 3,054,309; 5,201,454; and 5,244,140 which are incorporated herein by reference. The transducers generally are formed of stainless steel and have a welding end for supporting a welding tool for holding a wire to be welded to an integrated circuit (IC) or to a carrier package. The opposite end supports a source such as a piezoelectric ceramic crystal device for causing the body to vibrate at a desired frequency for welding purposes. A mount is provided for supporting the transducer and the piezoelectric crystal device is driven by a power supply for operating the transducer for a given bonding cycle.

The use of high frequencies allows better reactivity and higher energy levels that enhances the welding process of dissimilar or similar metals. In summary, the high frequency ultrasonics provides for better welding between metals.

A property of the high frequency ultrasonics is the low amplitude of motion at the tip of the welding tool. This low amplitude can be considered as a negative factor when high metal displacements are sought to weld for example bigger diameter wire or harder metal surfaces.

SUMMARY OF THE INVENTION

It is an object of the invention to provide an ultrasonic transducer and power source such that the same transducer can be operated at a high ultrasonic frequency and at a low ultrasonic frequency such that high frequency low amplitude displacement (welding) and low frequency high amplitude displacement (welding) can be achieved without changing power sources or transducers.

The power source is of the type that can be operated to provide high and/or low frequency power for operating the transducer.

DESCRIPTION OF THE PREFERRED EMBODIMENTS

Figure 1:
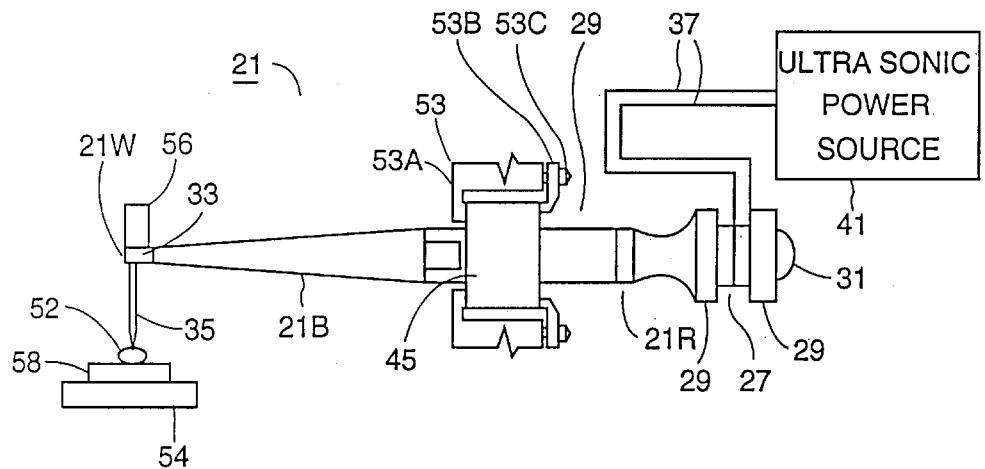
FIG. 1 illustrates an ultrasonic transducer, a mount for the transducer and a power supply coupled to the piezoelectric crystals of the transducer.
Figure 2:
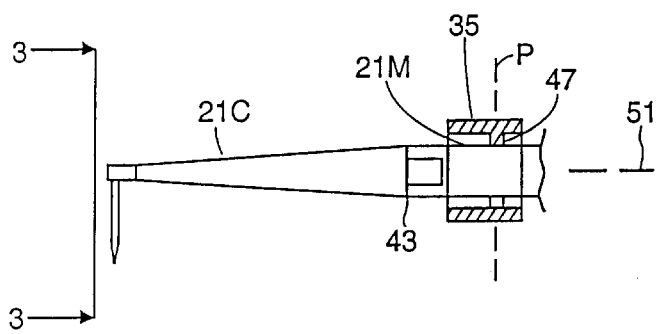
FIG. 2 illustrates a cross section of the mount of FIG. 1 coupled to the transducer.
Figure 3:
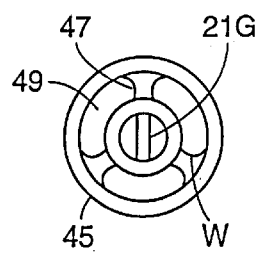
FIG. 3 is an enlarged view of the transducer of FIG. 2 as seen from lines 3—3 thereof with the welding tip removed.
Figure 7:
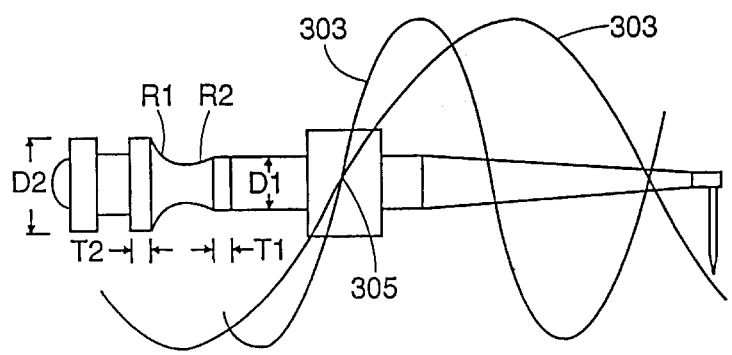
FIG. 7 illustrates high and low frequency waveforms relative to the clamp point or node point of a transducer.

Referring now to FIGS. 1–3, an ultrasonic transducer is identified by reference number 21. It comprises a stainless steel body 21B having a welding end 21W and an opposite end 21R for supporting a source which in the embodiment disclosed, is a piezoelectric ceramic crystal device 27 for causing the body to vibrate at a desired frequency for welding purposes. The crystals 27 are annular members held between two washers 29 which are connected to the rear end 21R of the body 21B by a bolt 31 screwed into a threaded aperture (not shown) extending into the end 21R of member 21B. The welding end 21W has a gap 21G leading to an aperture 33 formed therethrough for receiving a welding tip 35 which is secured therein by a set screw (not shown). The welding tip may be a capillary for holding the wire to be bonded to form a ball bond or a tool for holding the wire to form a wedge bond. Electrical leads 37 are connected to the crystals and to a relatively high frequency electrical source 41 for actuating the crystals 27 for producing a voltage at the desired level and at the desired frequency.

The transducer body 21B is solid and has a cone shaped portion 21C from end 21W to position 43 with a stainless steel cylindrical mount 45 secured to the body portion 21M between position 43 and the crystals 27. As shown in FIG. 3, the cylindrical mount 45 is spaced from the body 21B substantially 360 degrees around the cylindrical body portion 21M by three stainless steel spokes 47 located in the same plane and which extend from the body portion 21M to the inside of the cylindrical mount 45. The centers of adjacent spokes are spaced 120 degrees apart. Arcuate gaps 49 extend between adjacent spokes 47, body portion 21M, and the inside of the cylinder 45. The spokes 47 provide an electro-mechanical restrictive path that isolates the transducer vibrating body from the mounting or holding assembly. The electro-mechanical isolation technique achieves two objectives; first, it provides a mechanical resistance that isolates the ultrasonic energy generated by the piezo ceramic crystals or motor stack and thus improves operating efficiency, and second, it beneficially stabilizes electrical parameters, presenting a transducer load which is easier to control at the generating source.

To further improve transducer performance, the thin contacts or spokes are aligned to the acoustical vibrating node of the operating frequency forcing the vibratory (ultrasonic) energy to be transferred directly from the motor stack (piezo stack) to the welding tip. This is done by locating the spokes 47 at the node or point of minimal wave motion along the length of the transducer body.

In FIG. 1 two removable clamps 53 are shown connected to the mount 45 for supporting the mount 45 and transducer 21 to structure of the welding system. Each clamp 53 comprises a hook shaped member 53A coupled to one end of the cylinder 45 and to a L-shaped member 53B which is coupled to the other end of the cylinder 45 and to member 53B by a bolt 53C. For more information of the transducer mount 45 reference is made to U.S. Pat. No. 5,364,005.

In FIG. 1, the transducer 21 is illustrated as bonding a metal wire lead 52 to a bond site 58 of an integrated circuit 54 at high frequency. The wire 52 may be gold and the bond site 58 may be aluminum. The bond site 58 may be the metal connecting or bond pad of an IC. Member 56 is a pressure source for applying pressure to the transducer. The transducer also may be used to bond a heavy metal or the other end of the lead 52 lead to a base member at low frequency. The base member may be the metal lead frame of the IC circuit.

The clamp point of the mount 45 is at the node point of the resonant frequency of the transducer and at the node point of secondary harmonics above or below the main resonance frequency driving the transducer. Two secondary harmonic frequency waveforms are shown at 301 and 303. Both of these waveforms pass through the mode point 305. The transducer may be operated at a high frequency for example of up to 1.5 mhz and at a lower frequency of for example 50 or 60 khz. Frequency ranges of interest are 50–123 khz, 100–200 khz, 140–300 khz, and 200–500 khz. The higher frequencies are desired for ball bonding and wedge bonding.

In one embodiment the transducers 21 for producing these frequencies may have the following dimensions. D1 and D2 may be equal to 0.250–1.000 inches. T1 and T2 may be equal to 0.005–0.500 inches. The radii R1 and R2 may be equal to 0.005–1.000 inches. The overall length of the resonator 21 may be 0.0250–2.00 inches.

Figure 4A:
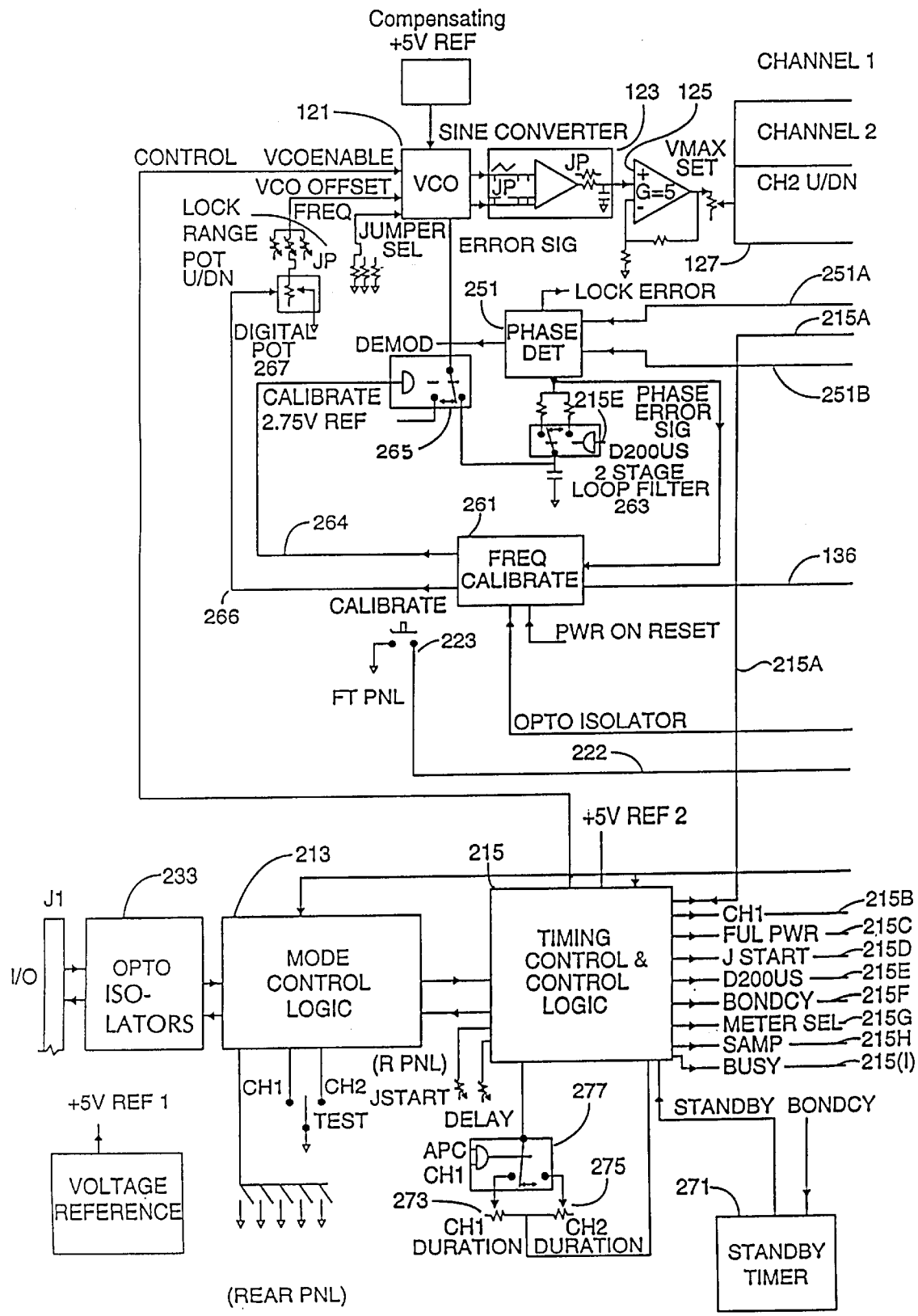
FIGS. 4A and 4B is a block diagram of a power supply. The complete circuitry of the power supply can be viewed by placing the right edge of FIG. 4A next to the left edge of FIG. 4B.
Figure 4B:
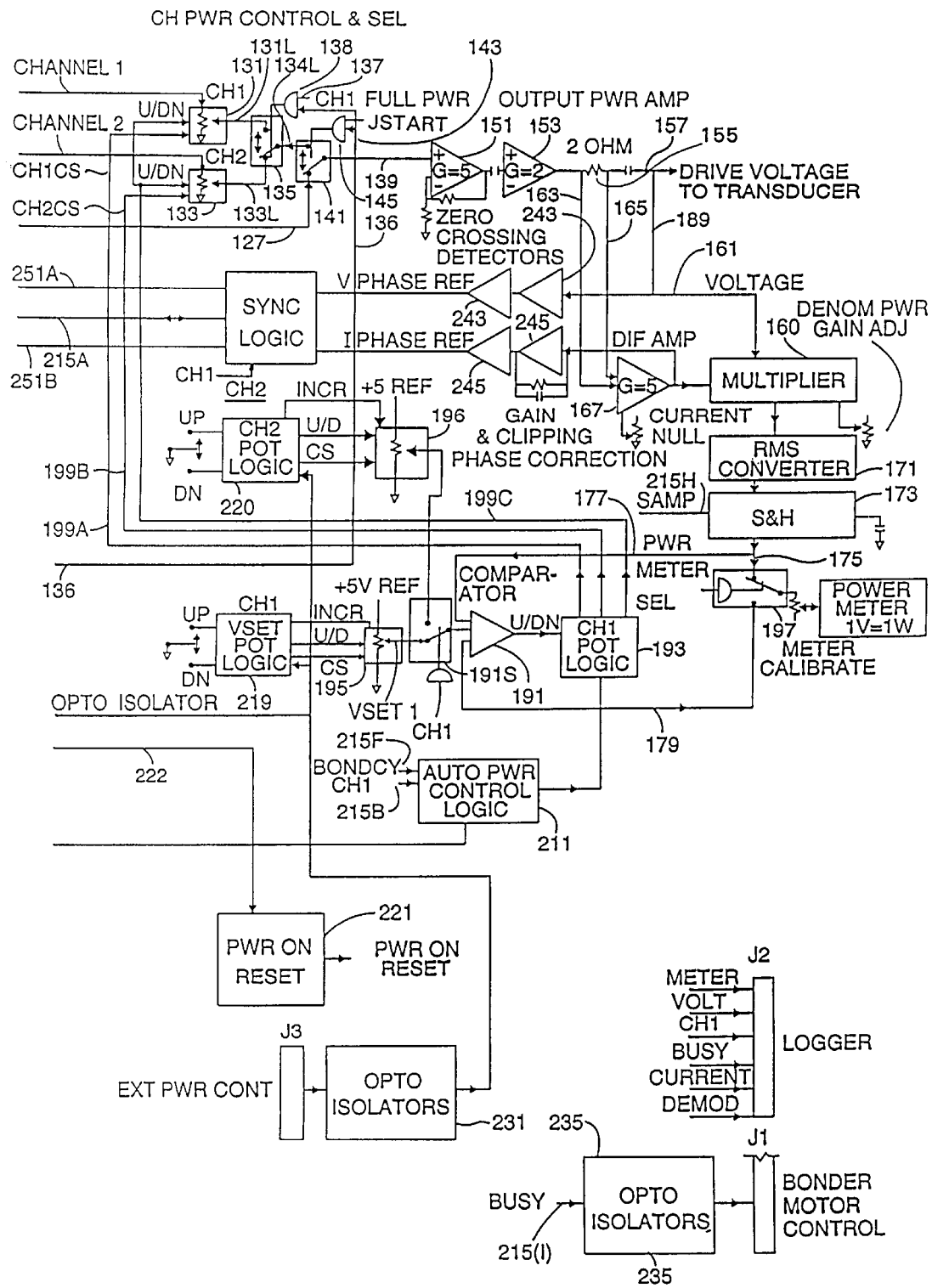

Referring now to FIGS. 4A and 4B the drawings, there will be described the power supply 41. A voltage controlled oscillator 121 periodically produces a triangle or square wave at a frequency which may be between 50 KHz and 1.5 MHz for operating the ultrasonic transducer for bonding or welding purposes. The triangle wave is converted to a sine wave by circuitry 123 whose output is amplified by amplifier 125. The output of the amplifier is applied to a by-pass lead 127 and to channel 1 and channel 2 Amplitude control potentiometers 131 and 133. Potentiometers 131 and 133, are digital potentiometers and can be adjusted electronically to control the power level for each channel. During bonding, one of the channels will be coupled to the transducer for operating the transducer. Channel 1 is used for bonding electrical leads to silicone chips and channel 2 may be used for the same purpose or to bond electrical leads to the main frame. When either channel 1 or channel 2 is selected, the power to the transducer is maintained constant with the use of preset reference voltages, a comparator, and feedback circuitry. When either channel is selected, the power to the transducer will be compared to the preset reference voltage for that channel and the potentiometer 131 of channel 1 (or 133 of channel 2) will be adjusted up or down to maintain its output power level constant.

Figure 5:
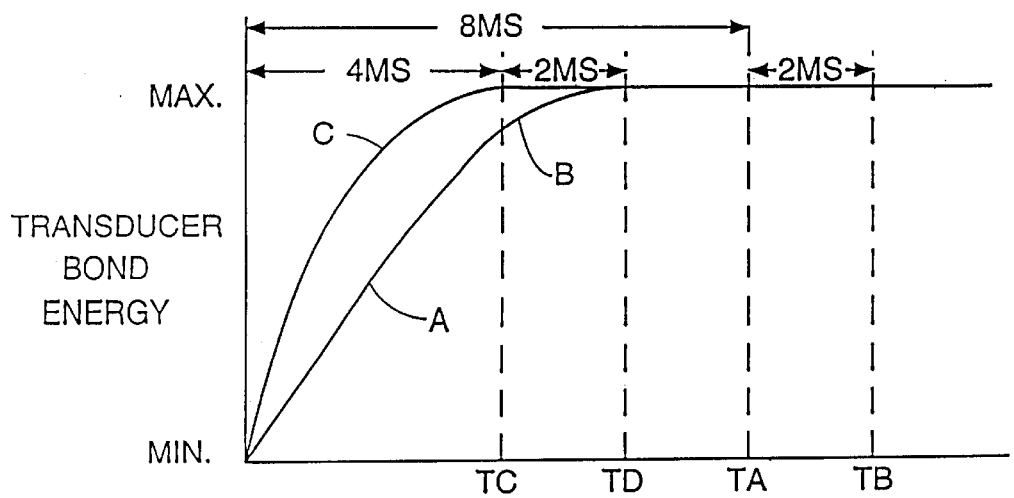
FIG. 5 illustrate the ramp time of an ultrasonic transducer during a bond cycle.

Switches 135 and 141 are electronic switches. Gate 138 is coupled to switch 135 and has leads 136 and 137 coupled thereto. Switch 135 provides conduction from lead 133L to lead 134L when CH1 on lead 137 is low such that the output of channel 2 passes through the switch. When CH1 on lead 137 is high, conduction will be through the switch 135 from lead 131L to lead 134L such that the output of channel 1 passes through the switch. Gate 145 is coupled to switch 141 and has leads 136 and 143 coupled thereto. When the J start signal on lead 143 is high, switch 141 provides conduction from lead 127 to lead 139, such that the output of the amplifier 125 passes by way of the by-pass lead 127 to lead 139, by-passing channels 1 and 2. Lead 139 is coupled to power amplifier 151 which is coupled to power amplifier 153 the latter of which is coupled to a 2 ohm resistor 155 and then to lead 157 which applies the voltage drive to the transducer. When the J start signal on lead 143 is low, conduction through switch 141 is from lead 134L to lead 139 whereby the output from the selected channel 1 or 2 will be applied to lead 139 and to the transducer. The maximum voltage peak to peak that can be applied to the transducer in one embodiment is 26 volts. The bonding voltage applied to the transducer as determined by the potentiometers 131 or 133 is between 26 volts and 4 volts peak to peak. If channel 1 or channel 2 is to be selected, and the jump start function is enabled then switch 141 will be activated and, full power will be applied to the transducer for a short period of about 200 to 800 microseconds after which reduced power from potentiometer 131 or potentiometer 133 will be applied to the transducer. The total bonding time period may be between 1 millisecond and 500 milliseconds. Thus at the beginning of the bond cycle, a burst of maximum energy is applied to the transducer (jump start). The energy then tapers down to the programmed power that is set by the potentiometers 131 or 133 of channels 1 or 2. The normal ramp time of the transducer from zero to the time where maximum bonding energy is delivered by the transducer is illustrated by portion A of the curve B of FIG. 5. This time may be 8 milliseconds with the maximum bonding efficiency occurring between times Ta and Tb which may be 2 milliseconds. Thus the total bonding cycle in this case is at least 10 milliseconds. By applying a maximum burst of energy to the transducer at the beginning of the bond cycle, the ramp time may decrease from 8 milliseconds to 4 milliseconds and the transducer reaches full power in a much shorter period, as shown at time Tc in FIG. 5 of curve portion C with the two milliseconds bonding time occurring between Tc and Td. Thus total bonding cycle in this case is reduced to 6 milliseconds.

Thus as can be understood, the same bonding time can be obtained at an earlier period in the bond cycle thereby allowing more welds to be achieved in a given time period and decreasing the heat applied to the IC during bonding resulting in more welds being achieved with better quality in the bond. The jump start power allows one to compensate for the mechanical lag or resistance that the transducer has by design. Inherent problems of an ultrasonic transducer is that it is very slow to respond to acoustical signals. In order to compensate for that lag problem, a maximum burst or power is applied to the transducer to get it started very quickly so the ramp time of the transducer reaches maximum power in a shorter time than if the ultimate desired power was applied to the transducer over the entire bonding cycle. This allows the operator to do welding or bonding in a shorter time than normal bonding and hence allows more circuits to be welded in a given time period. In addition, it enhances the quality of the weld, since the circuit being welded will be subjected to the heat and power of the welding system for a shorter period of time. At the beginning of the bond cycle, channels, 1 and 2 are bypassed to obtain full power to the transducer. When the switch 141 is actuated to allow conduction from lead 134L to lead 139 and when switch 135 is in either of its two conditions determined by the CH1 signal, channel 1 or channel 2 is selected and the potentiometer 131 of channel 1 or the potentiometer of channel 2 will divide down the voltage applied thereto to the desired welding voltage.

The voltage to the transducer is applied by leads 159 and 161 to a multiplier 160. Current is measured by measuring the voltage across the resistor 155. The voltage across the resistor 155 is applied by way of leads 163 and 165 to a differential amplifier 167 whose output is applied to the multiplier 160. The multiplier 160 converts the current and voltage applied thereto to power. The multiplier 160 is an IC electronic multiplier and the output is peak to peak power. The output of the multiplier 160 is applied to a root mean square circuit 171 which converts the peak to peak power to root mean square value or average real power. The output of RMS 171 is applied to a sample and hold circuit 173. The sample and hold circuit converts the pulse output of the RMS circuit 171 to a continuous signal and it holds the signal during the period that the signal is not present. It acts as a storage device. It samples the power level during the pulse and holds it until the next pulse. If the next pulse is too low or too high, the system will force the power to increase or decrease to obtain a constant power. Thus the sample and hold samples and holds the power level. The output of the sample and hold is applied to a power meter 181 by way of lead 175 and switch 197 and by way of lead 177 to a comparator 191. The power meter produces a continuous visual reading of the power being applied to the transducer. The comparator 191 compares the real power from the sample and hold 173 to a preset power. Leads 177 and 179 are coupled to the comparator 191 whose output is coupled to a pot logic 193. The pot logic 193 generates CH1 and CH2 signals which are applied to pots 131 and 133 by way of leads 199A and 199B respectively. The pot logic 193 also produces a up/down signal which is applied to pots 131 and 133 by way of lead 199C. The CH1 signal will allow the up/down signal to control pot 131 only and the CH2 signal will allow the up/down signal to control pot 133 only. A reference preset voltage is obtained from a digital potentiometer 195 or a digital potentiometer 196 one of which is selected by a switch 191S for application of its output to the comparator 191. A CH1 signal applied to switch 191S normally controls the switch 191S to apply the output of logic 219 to the comparator 191 such that power to the transducer when channel 1 is selected (after switch 141 is actuated to disconnect the by-pass lead 127), is maintained constant. The power level of the preset power is adjusted by the operator to a level based on previous bonding operations. Assume that channel 1 is selected for bonding purposes. The power level of the preset power is adjusted by manually operating the up down switch of a channel 1 voltage set potentiometer logic 219 which applies to the potentiometer 195, a chip select signal to enable the potentiometer, an up down signal, and an increment signal to change the level of the potentiometer 195. When the power is not being used for bonding, the preset power is fed to lead 179 and switch 197 controlled by a meter select signal applies the preset power to the power meter 181 which can be visually observed by the operator. When bonding is being carried out, the switch 197 will apply the voltage on lead 175 to the meter 181 and allow the real power to be displayed by the meter. In addition, during bonding, the comparator 191 will compare the real power applied to the transducer to the preset power from circuit 195 and apply its output to the channel 1 potentiometer logic 193 which produces a CH1 signal and control signal which are applied to the potentiometer 131 by way of leads 199A and 199C for controlling the output of potentiometer 131. If the real power is greater than the preset power, the output of the comparator goes low and controls the logic 193 to produce a signal which is applied to the potentiometer 131 by way of lead 199C to increment the output of potentiometer 131 down, which lowers the power applied to channel 1 and hence the power applied to the transducer. If the real power is lower than the preset power, the output of the comparator goes high and controls the logic 193 to produce a signal which is applied to potentiometer 131 of channel 1 to cause the potentiometer 131 to raise the power of channel 1 and hence the power applied to the transducer.

The digital potentiometer 195 in the comparator system has a built in nonvolatile memory so when the operator turns the power off, the next time the system is turned on, the preset power will come back to where it was at the time that it was last turned on.

An auto power control logic 211 is coupled to the potentiometer logic 193, to a mode control logic 213, and the timing control 215. The power control logic 211 receives a bond cycle signal and a channel 1 signal from the logic 215 and the pot logic 193 generates the CH1 and CH2 signals. The bond cycle signal is a square wave timing pulse which determines the time period of the bonding cycle to produce an output for controlling the timing of logic 193. During the next bond cycle, the transducer is used to make another bond.

In order to weld or bond with channel 2, a minus (not) CH1 is applied to switch 191S to allow the output of the pot logic 220 to be applied to potentiometer 196 for producing an output for application to the pot logic 193. Adjustment of the logic 220 is carried out in the same manner as adjustment of the logic 219. The CH2 signal and the up/down signal from pot logic 193 are applied to pot 133 for producing a constant output on channel 2 to the transducer in the same manner as described with respect to channel 1.

Channel 1 and channel 2 may be used for bonding on the substate of the IC. The sensitivity of the substate of the IC requires control of the energy applied during bonding due to the silicon or gallium oxide which requires the bonding to be controlled as much as possible compared to a bond in the substate of the carrier which may be gold plated ceramic or silver plated lead frame materials which have no active elements beneath or within the carrier that can be damaged. On the substate of the IC there are active elements such as diodes that can be easily damaged and hence controlled bonding is required.

Thus the power supply of the invention measures the current and voltage delivered to the transducer while the transducer is in contact with the bond wire and the bond pad and is actually making the bond and calculates the power being sent to the transducer. This power is compared to a preset value and is used to maintain the input to the transducer constant. This is done at one point during each bond cycle. This is important since the transducer is sensitive to the force exerted on the bond pad as well as temperature and clamping forces. Thus sensing the precise condition while the bonding takes place accurately provides the feedback necessary to maximize the repeatability of the bond parameters. It has been demonstrated that measurement of the input power is the best measure of the power going into the bond itself. Thus the invention measure the current and voltage of the energy being delivered to the transducer during each cycle; calculates the power; and uses the power to correct the level of the power going to the transducer before the next bond is made.

The circuit of the invention thus maintains the power to the transducer, when channel 1 or channel 2 is being used for bonding as close as possible to the preset power and avoids changes in the power to the transducer which may occur during bonding for the reasons set forth above or if for example, the transducer happens to detect something that is much hotter or some surface that is very soft that can cause mechanical changes to the transducer that can translate into an impedance variation or a decrease in the current that is going to the transducer.

The real time dynamic bonding transducer power control is applicable to both ball and wedge bonding procedures.

Referring to the other components of the circuit of FIGS. 4A and 4B, the power on reset 221 resets all of the logic when the power to the system is turned on. It resets all of the circuits and allows them to re-establish the correct power lever, resets all of the logic, and initiates the calibrating process. The calibrating process sweeps the frequency across the transducer to determine where the transducer previously was with respect to frequency and locks the power supply to the correct transducer frequency. The power reset is coupled by way of lead 222 to a manually operated calibrate switch 223. When the switch 223 is closed, the system will automatically go through the calibration procedure.

The power supply is controlled by external signals which tell the power supply when to start to bond and when to trigger channel 1 and when to trigger channel 2. These signals come from another machine and can be very noisy electrically. The isolators 231, 233, and 235 isolate the power supply from the noise from the external machines.

Figure 6:
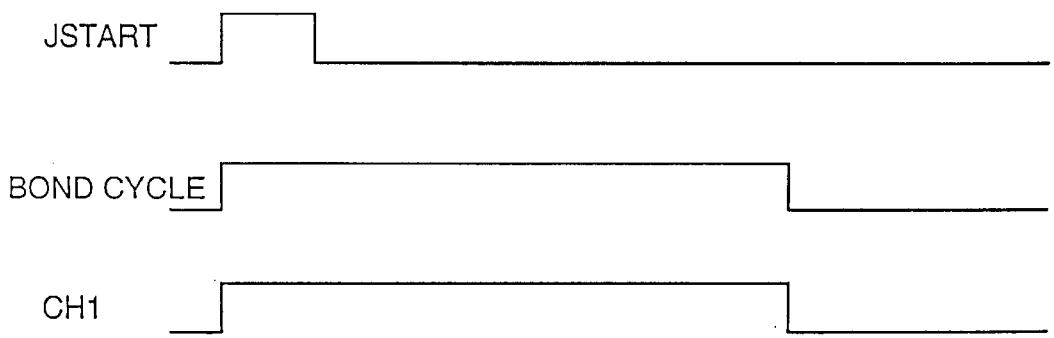
FIG. 6 illustrate waveforms produced by components of the power supply of FIGS. 4A and 4B.

The timing control & control logic system 215 and the mode control logic 213 provides all of the timing signals to leads 215A–215(I) to control the power supply. The systems 213 and 215 are formed of commercially available circuits. The timing sequence is programmed in the systems 213 and 215. A portion of the timing sequence is shown in FIG. 6.

As shown in FIGS. 4A and 4B the lead 215A is connected to a sync logic 241 which synchronizes the ultrasonic signal to the logic signal so that they occur at the same time. Voltage from lead 161 and current from the output of the differential amplifier 167 are amplified by amplifiers 243 and 245 and applied to the syn logic 241. The voltage and current are synchronized to the logic signal and fed to a phase detector 251 by way of leads 251A and 251B. The phase detector compares the relative phase of the voltage to the current and produces a phase error signal. It is high if the voltage leads the current and low if the voltage lags the current. The phase error signal is applied to the frequency calibration circuit 261 and to a two stage filter 263. The phase error signal is used to maintain the frequency of the VCO to that of the transducer. The circuit 261 uses the error signal during the calibration process. The phase error signal is a pulsed signal. The filter 263 filters the pulsed signal to a DC signal which is applied to the VCO by way of switch 265. When the VCO is first turned on, the filter is in a slower condition than when the VCO is in operation. The error signal applied from the filter 263 to the voltage controlled oscillator controls the frequency of the oscillator 121 which in turn controls the frequency of the voltage to the transducer and maintains the frequency of the power supply locked to the frequency of the transducer. For example, if there is a minus phase difference wherein the voltage lags the current, the phase error signal increases the frequency of the VCO which causes the phase difference to decrease. Conversely, if there is a plus phase difference wherein the voltage leads the current, the phase error signal decreases the frequency of the VCO which causes the phase difference to increase. The system of the invention is adjusted in order to obtain a constant phase shift between the voltage and the current.

The frequency calibrate circuit 261 initializes all of the frequency control components and circuits in the power supply. It compensates for temperature drift, etc. Its output goes by way of lead 264 to the calibrate switch 265 and by way of lead 266 to a digital potentiometer 267 used for calibration purposes. The digital potentiometer 267 changes the resistance which changes the frequency which calibrates the VCO 121 to the resonant frequency of the transducer. During calibration, 2.75 volts DC is used as a reference by switch 265. When in the automatic calibration mode, the switch 265 switches to 2.75 voltage to use an error voltage of 2.75 volts which is about midway between the upper and lower values of the error signal which varies between zero and five volts.

All of the circuitry is inside the controller so that even though there is error one does not see the error since it is inside of the controller. The system thus is a real time controller and the system keeps a very tight control of the shift in the frequency, voltage and current to maintain a very tight control over these parameters. Thus during the bonding cycle, these features can be monitored to guarantee repeatability.

The standby timer 271 allows the power supply to go to a standby mode when it is not being used for bonding and displays the power the operator wants to bond at on the meter 181.

The mode control logic 213 is used also to determine manually whether channel 1 or channel 2 is to be tested. This can also be done automatically.

Elements 273 and 275 are manually operated potentiometers for use for controlling the duration of the CH1 and CH2 signals. Switch 277 is employed to select channel 1 or channel 2 for test purposes. Normally channel 2 is selected. An APC signal and a CH1 signal tells the switch 277 to select channel 1 for test purposes during calibration.

The timing signal D200US is a 200 microsecond delay which goes to the two stage loop filter 263. The busy signal goes outside through output isolators.

The mode control logic allows the system to be switched to an automatic mode where a computer takes care of all of the timing and control or to a manual control where the operator operates all of the switches from the outside. The mode control 213 also determines whether channel 1 or channel 2 is selected during testing.

In conducting bonding operations, an apparatus may be employed to automatically move the transducer 21 to one bond site to allow bonding with channel 1 and then to another bond site to allow bonding with channel 2. Channel 1 may be used to bond electrical leads to silicone chips and channel 2 may be used to bond to bond electrical leads to the main frame. In this case, the channel 1 frequency is higher than the channel 2 frequency whereby during bonding, the ultrasonic frequency produced by the transducer 21 is higher during the channel 1 bonding time and lower during the channel 2 bonding time.

Figure 8:
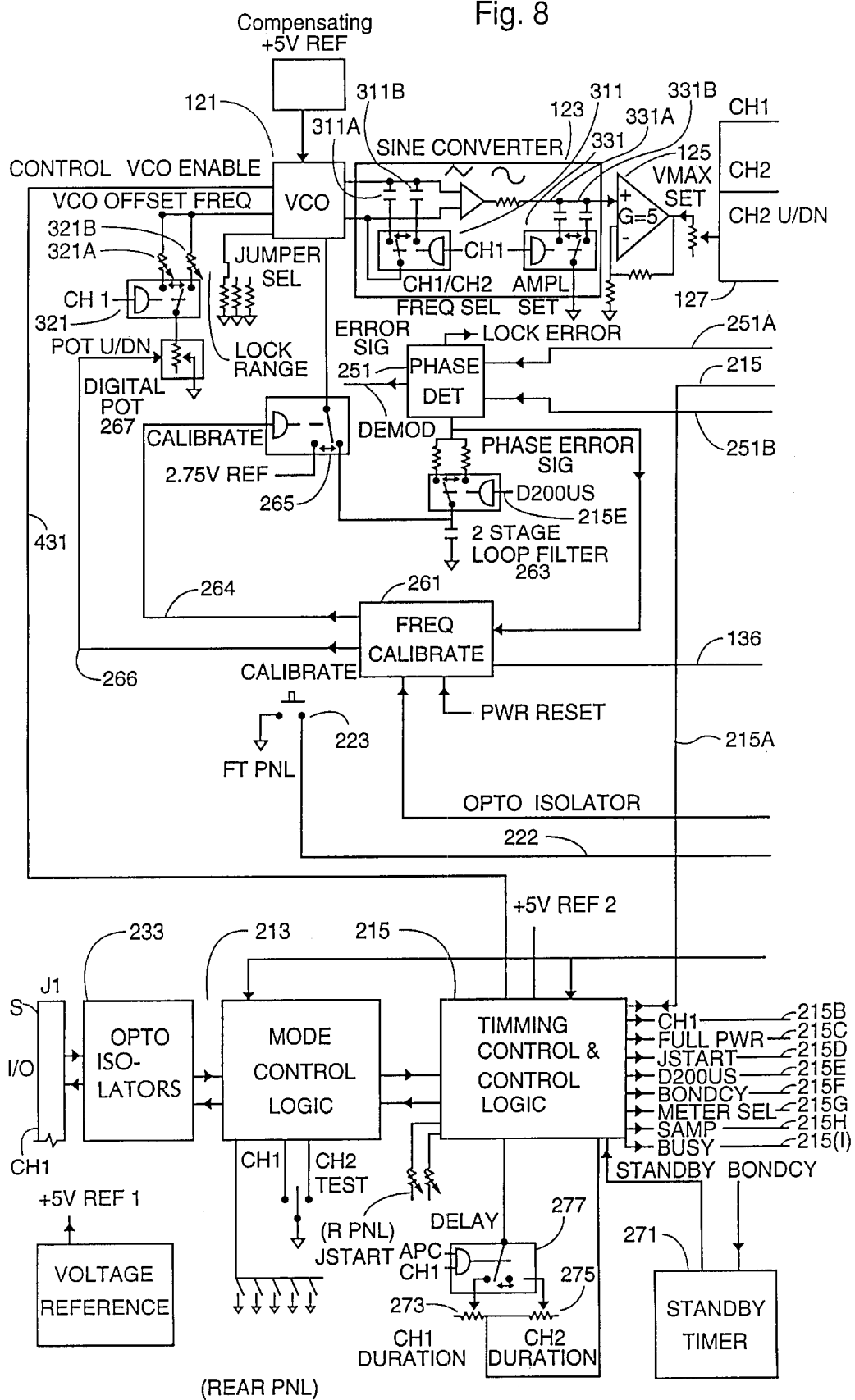
FIG. 8 illustrates a modification of the circuitry of FIG. 4A with additional circuitry for changing the frequency of operation of the transducer.

The dual frequency ultrasonic transducer driver for driving the transducer 21 at two different frequencies will be described with reference to FIGS. 4A, 8 and 9. The operation of the dual frequency driver is identical to the single frequency system of FIGS. 4A and 4B with the addition of circuitry to select different frequencies for the Channel 1 and Channel 2 bond times. Referring to FIG. 8, a digitally controlled FET analog switch 311 is used to select a timing capacitor 311A or 311B for either Channel 1 or Channel 2 frequency. The switch is controlled by the select logic or channel enable signal CH1. A digitally controlled FET analog switch 321 is used to select a timing resistor 321A or 321B for either the Channel 1 or Channel 2 frequency. The switch is controlled by the CH1 select logic signal. A digitally controlled FET analog switch 331 is used to select a filter capacitor 331A or 331B in the RC filter circuit. The RC filter circuit is used to convert the triangle wave shape output of the VCO to sine wave shape. The switchable capacitor maintains a constant output signal amplitude at the two selected frequencies. The switch 331 is controlled by the CH1 logic signal.

Referring also to FIG. 4B, the Sync Logic function 241 contains some noise masking circuit functions. These noise mashing functions are frequency sensitive and as such, internal circuit timing is changed for either Channel 1 or Channel 2 frequency. This timing change is controlled by the CH1 logic signal.

Figure 9:
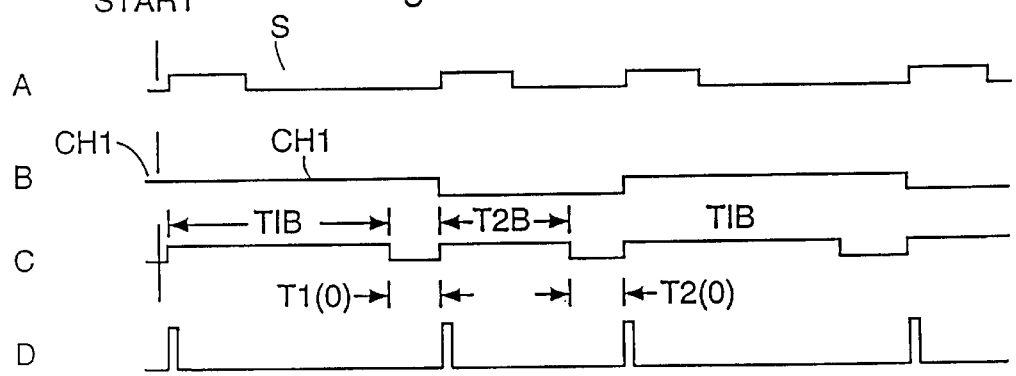
FIG. 9 are waveforms useful in understanding the circuitry of FIGS. 4A, 4B, and 8.

FIG. 9a shows a start signal S; FIG. 9b shows the channel select logic or enable signal CH1; FIG. 9c shows the actual bonding times when the transducer is on; and FIG. 9D shows the jump start signal which initiates full power to the transducer when it is high. The start signal and the channel enable signal CH1 may be external signals applied to J1 of FIG. 8. The start signal of FIG. 9A initiates timers in logic 215 to cause the VCO 121 to start and then shut down twice during each cycle to allow bonding to take place during T1A and T1B. The CH1 signal is applied to the system from the control logic 215. When CH1 is high, channel 1 is selected and bonding takes place at time T1(B). The transducer is moved to another bond site and when the transducer is being moved, the VCO 121 and hence the transducer is shut down. This occurs at time T1(O) (and T2(O)). The traces of FIG. 9 are not to scale and T1(O) will be greater than shown. The VCO is controlled by the VCO enable signal on line 431 in FIG. 8. When CH1 is low, channel 2 is selected and bonding takes place at time T2(B). The transducer is moved to another set of bond sites and when the transducer is being moved, the VCO 121 is shut down. This occurs at T2(O). The cycle then repeats for bonding on channels 1 and 2 at times T1(B) and T2(B) at two different bond sites such that during each cycle there is a channel 1 bond time and a channel 2 bond time for two bond sites.

During the Channel 1 bond time T1(B) the switches 311, 321, and 331 are controlled by TTL logic signals to (CH1) select the appropriate capacitors and resistors to produce a higher frequency drive signal for operating the transducer to produce a high ultrasonic frequency. During the Channel 2 bond time T2(B), the switches 311, 321, and 331 are controlled by TTL logic signals (CH1) to select the appropriate capacitors and resistors to produce the lower frequency drive signal for operating the transducer to produce a lower ultrasonic frequency. The cycle then repeats such that during each cycle there is a Channel 1 bond time and a Channel 2 bond time. For a complete cycle, power from amplifier 125 initially by-passes channels 1 and 2, when J start is high, and is applied directly to the power amplifier 151 and hence to the transducer. When J start is low and CH1 is high, the output from channel 1 passes through switches 135 and 141 and is applied to the transducer. The transducer during T1(O) is shut down while it is moved to the second site. Power from amplifier 125 initially by-passes channels 1 and 2, when J start is high, and is applied directly to the power amplifier 151 and hence to the transducer. When J start is low and CH1 is low output of channel 2 switches 131 and 141 is applied to the transducer during T2(B). Thus although not shown in FIG. 9, a maximum burst of energy will be applied to the transducer at or immediately prior to the beginning of each bond time T1(B) and T2(B) respectively when J start is high.

Figure 10:
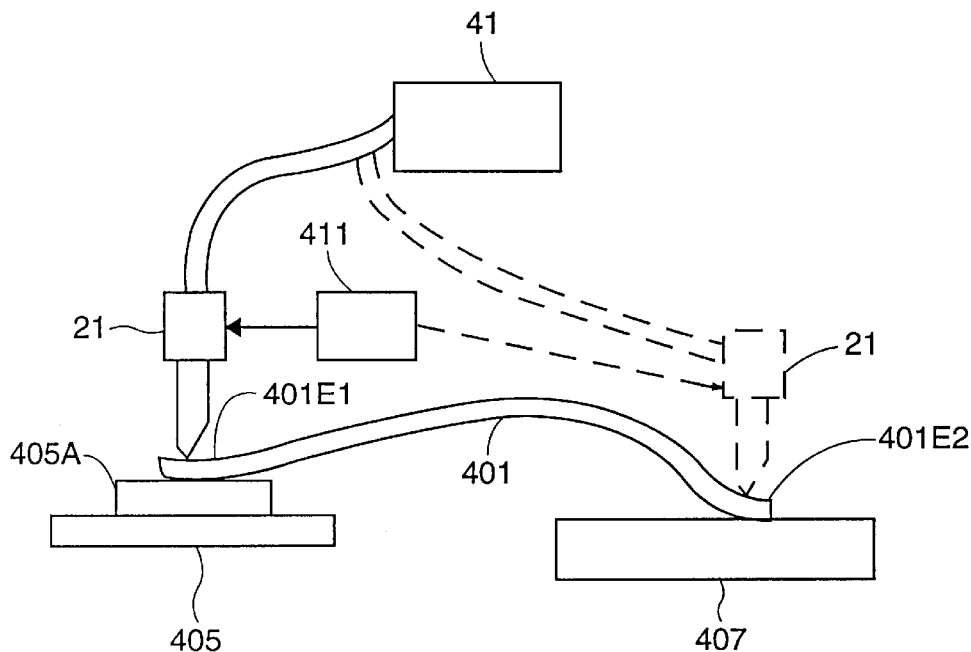
FIG. 10 illustrates an automatic bonding system.

Referring to FIG. 10, the transducer 21 coupled to the power supply 41 of FIGS. 4A, 4B modified as shown in FIG. 8, may be used to bond one end 401E1 of a metal lead 401, to a metal bond site 405 and a second end 401E2 of the metal lead 401 to a second bond site 407 at different frequencies. The bond site 405 may be an integrated circuit having an aluminium connecting pad 405A and the bond site 407 may be a main frame formed i.e. of copper. The wire may be formed of aluminum. The transducer 21 is first transported automatically by well known state of the art apparatus 411 to the first bond site 405 and then to the second bond site 407. The wire end 401E1 is bonded to the lead section 405A during the T1(B) bond time at a high frequency for example of 150 khz and the wire end 405E2 is bonded to the second bond site 407 during the T2(B) bond time at a lower frequency for example of 60 khz. The cycle then is repeated to bond the opposite ends of a lead to two different bond sites. It is to be understood that bonding with the Channel 2 lower frequency may occur at the bond site 405 and bonding with the Channel 1 higher frequency may occur at the bond site 407.

The first frequency will always be associated with Channel 1 bond and the second frequency will always be associated with Channel 2 bond. The first and/or second frequencies are selected via the two different resistor capacitor networks 311A, 311B, 321A, 321B, 331A, 331B. These networks control the frequency of oscillation of the voltage controlled oscillator 121 (VCO). The VCO 121 is part of the phase lock loop provided by units 251, 261, 263 of the ultrasonic power generator. Each frequency is set to the approximate resonant frequency of the ultrasonic transducer. The exact resonant frequency is automatically set and controlled by the phase lock loop. A single phase lock loop is used for both frequencies with only the value of the RC networks being changed or switched for each frequency. The selection of the RC networks is employed by using solid state FET analog switches 311, 321, 331 which are controlled by a TTL logic signals (CH1). The TTL logic signals (CH1) are the same signals that controls the first and second bonds. For example, in FIG. 9 the CH1 logic signal is high and then and low to control the FET's 311, 321, 331 to produce a high frequency and then a low frequency during each complete bond cycle.

Figure 11:
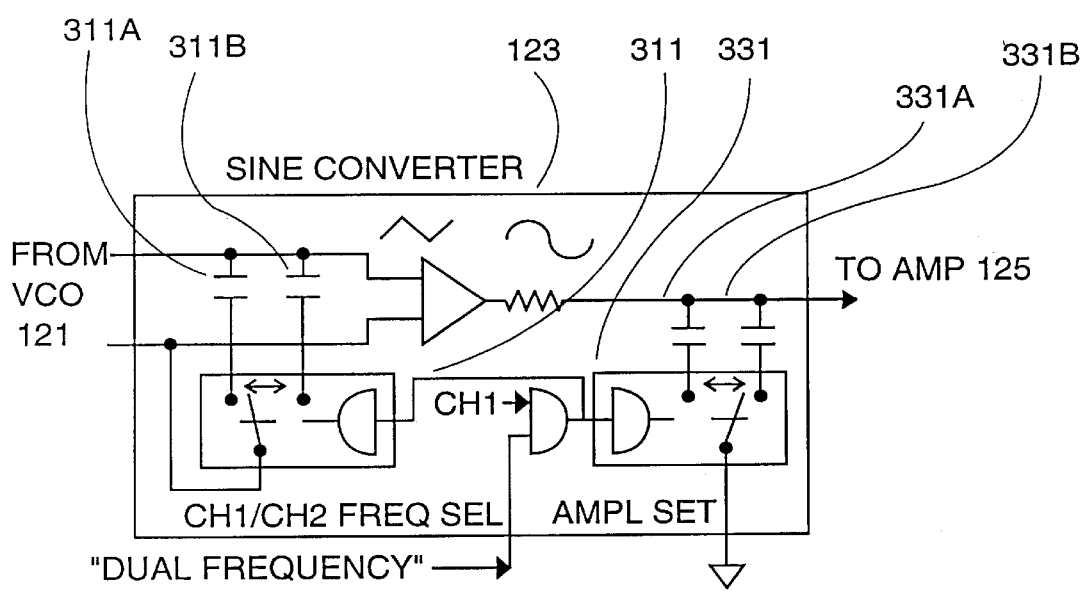
FIG. 11 is a modification of FIG. 8.

Reference is made to FIG. 11 for a modification of the circuitry of FIG. 8 which allows either dual frequency drive signals to be produced during T1(B) and T2(B) or a single frequency drive signal to be produced during T1(B) and T2(B). The circuity of FIG. 11 will be substituted for the FET switches 311 and 331 of FIG. 8 between the VCO 121 and amplifier 125. In FIG. 11, like reference numerals identify like components of FIG. 8. A "dual frequency" signal and CH1 are applied to the AND gate 433. The "dual frequency" signal is either continuously low or continuously high during a complete cycle. If the "dual frequency" signal is high, it allows the CH1 signal to pass to both FETs 311 and 331 to obtain i.e. high and low drive frequencies during T1(B) and T2(B). If the "dual frequency" signal is low, it inhibits CH1 from passing to the FETs 311 and 331 and in this case the system is prewired to allow only one drive frequency (i.e. 150 khz or 60 khz) to pass to amplifier 125 during T1(B) and T2(B). The "dual frequency" signal may be obtained from the circuity 213 and 215 of FIG. 4A.

We claim:

1. A method of carrying out bonding operations at first and second metal bond sites with the use of an ultrasonic transducer having an electrically activated vibrating means for vibrating said transducer, wherein said electrically activated vibrating means is activated by an output voltage obtained from a power supply, comprising the steps of:

operating said power supply to apply an output voltage of a first frequency to said electrically actuated vibrating means for vibrating said transducer at a first ultrasonic frequency for carrying out bonding operations at said first bond site during a first portion of a given cycle, operating said power supply to apply an output voltage at a second frequency to said electrically actuated vibrating means for vibrating said transducer at a second ultrasonic frequency for carrying out bonding operating at said second bond site during a second portion of said given cycle, obtaining voltage and current functions from said output voltage while bonding is being carried out and deriving a power function from said voltage and current functions, comparing said power function with a preset voltage function to obtain a correction function, sing said correction function to maintain the level of said output voltage substantially constant while bonding is being carried out.

2. A method of carrying out bonding operations at first and second metal bond sites with the use of an ultrasonic transducer having an electrically activated vibrating means for vibrating said transducer, wherein said electrically activated vibrating means is activated by an output voltage obtained from a power supply, comprising the steps of:

operating said power supply to apply an output voltage of a first frequency to said electrically actuated vibrating means for vibrating said transducer at a first ultrasonic frequency for carrying out bonding operations at said first bond site during a first portion of a given cycle, operating said power supply to apply an output voltage at a second frequency to said electrically actuated vibrating means for vibrating said transducer at a second ultrasonic frequency for carrying out bonding operating at said second bond site during a second portion of said given cycle, wherein during an initial part of said given cycle, applying a higher voltage output to said vibrating means than during said first and second portions of said given cycle wherein bonding is carried out during said first and second portions of said given cycle.

3. A method of carrying out bonding operations at first and second metal bond sites with the use of an ultrasonic transducer having an electrically activated vibrating means for vibrating said transducer, wherein said electrically activated vibrating means is activated by an output voltage obtained from a power supply, comprising the steps of:

operating said power supply to apply an output voltage of a first frequency to said electrically actuated vibrating means for vibrating said transducer at a first ultrasonic frequency for carrying out bonding operations at said first bond site during a first portion of a given cycle, operating said power supply to apply an output voltage at a second frequency to said electrically actuated vibrating means for vibrating said transducer at a second ultrasonic frequency for carrying out bonding operating at said second bond site during a second portion of said given cycle, during an initial part of said given cycle, applying a higher voltage output to said vibrating means than during said first and second portions of said given cycle wherein bonding is carried out during said first and second portions of said given cycle, obtaining voltage and current functions from said output voltage while bonding is being carried out and deriving a power function from said voltage and current functions, comparing said power function with a preset voltage function to obtain a correction function, and using said correction function to maintain the level of said output voltage substantially constant while bonding is being carried out.

4. A method of carrying out bonding operations, employing an ultrasonic transducer for producing an ultrasonic output for bonding purposes, and a power supply coupled to said transducer for operating said ultrasonic transducer for producing said ultrasonic output, said method comprising the steps of:
sequentially producing an output voltage at first and second different frequencies for operating said transducer sequentially at said first and second frequencies for sequentially producing an ultrasonic output at said first and second frequencies wherein said first and second frequencies are based upon the resonant frequency of said transducer.

5. A method of carrying out bonding operations, employing an ultrasonic transducer for producing an ultrasonic output for bonding purposes, a power supply coupled to said transducer for producing a power output for operating said transducer for producing said ultrasonic output, and control means for selectively causing said power supply to be operated in a first mode to produce said power output during first and second time periods at first and second different frequencies respectively and in a second mode to produce said power output during said first and second time periods at the same frequency, wherein a chosen frequency is based upon the resonant frequency of said transducer, said method comprising the step of:

operating said power supply in one of said modes for carrying out bonding operations.

* * * * *